April 23, 1968 KIICHI KOMATSUBARA 3,379,999

SOLID STATE OSCILLATOR OPERATIVE IN THE QUANTUM LIMIT REGION

Filed Sept. 20, 1966

INVENTOR

KIICHI KOMATSUBARA

BY Paul M. Craig, Jr.

ATTORNEY

United States Patent Office 3,379,999

Patented Apr. 23, 1968

3,379,999

SOLID STATE OSCILLATOR OPERATIVE IN THE QUANTUM LIMIT REGION

Kiichi Komatsubara, Kodaira-shi, Japan, assignor to Hitachi, Ltd., Marunouchi, Chiyoda-ku, Japan, a corporation of Japan Filed Sept. 20, 1966, Ser. No. 580,647
Claims priority, application Japan, Sept. 27, 1965, 40/58,691
7 Claims. (Cl. 331—107)

ABSTRACT OF THE DISCLOSURE

A solid state oscillator including a semiconductor element operating in an environment where it is subjected simultaneously to a magnetic field and a crossed electric field at a low temperature. The oscillation is generated in the region where all of the carriers in the semiconductor element energized by the electric field are allowed to be populated in the lowest quantum state of the quantized discrete states established by the application of the magnetic field.

The present invention relates to solid state oscillators which generate self oscillation by applying crossed electric and magnetic fields thereto at a low temperature.

Heretofore, various solid state oscillators have been proposed. All of the oscillators of the prior art utilized the self oscillation caused within the bulk of an element or at the junction by applying an electric field or a magnetic field to said element or utilized the negative resistance of the element. The devices of the prior art had their own individual mechanism, but they had their own disadvantages such that some of them required a high voltage, some others were restricted in their oscillation frequency by the geometry of the element, and still others showed gradual damping of the oscillation.

It is the primary object of the present invention to provide a solid state oscillator which eliminates the shortcomings of the devices of the prior art. The present invention is characterized by comprising means to apply an electric field to a semiconductor element having a low impurity concentration held at a low temperature and means to apply a magnetic field to said element in a direction not parallel to the direction of said electric field, and adapted to cause oscillation by setting said electric and magnetic fields in a range in which said element is operated in a non-linear decreasing resistivity ratio region of its electric field-current characteristic curve near or at the quantum limit, that is at the region showing the condition $\omega_c\zeta>\epsilon_f$ (Fermi level).

The present invention will be more clearly understood by reading the following detailed descriptions on some of the examples of the present invention with reference to the accompanying drawings, wherein.

Figure 1:
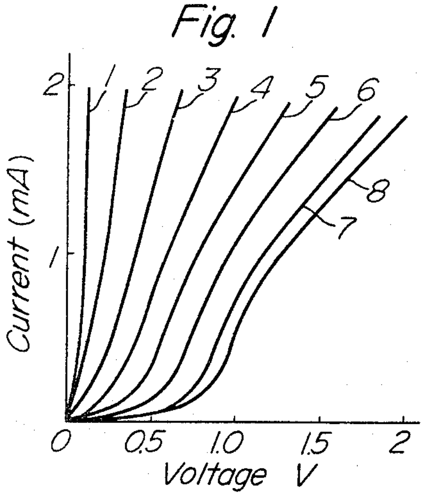
FIG. 1 is a diagram showing the voltage-current characteristics of a semiconductor element.
Figure 2:
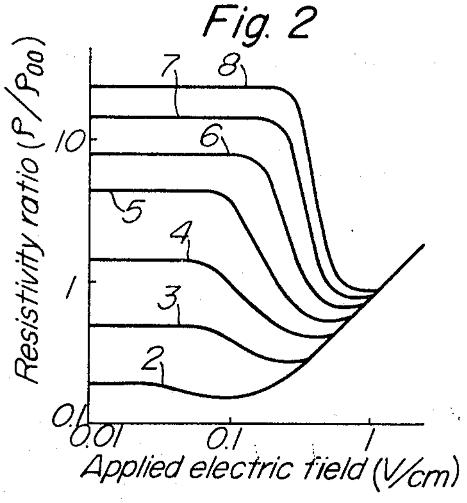
FIG. 2 is a diagram showing electric field-resistance ratio characteristics derived from the diagram of FIG. 1.

Description will now be directed to the result of an experiment conducted according to the present invention. A suitable semiconductor element is prepared by attaching lead wires, in ohmic contact, to the opposite ends of a sample bar composed of an InSb or a PbTe bulk having an impurity concentration in the order of $10^{14}$ atoms/cc. A magnetic field of a strength ranging between 2000 gauss and 13,500 gauss is applied to said element in a direction transverse to the direction of the electric field applied thereto. While holding the specimen at the temperature of liquid helium, the voltage to current relationship of the element was studied, and the voltage-current characteristics as shown in FIG. 1 were observed. In FIG. 1, curves 1, 2, 3, 4, 5, 6, 7 and 8 represent the characteristics, respectively, for the strengths 0, 2, 4, 6, 8, 10, 12 and 13.5 kilogauss of the applied magnetic field. From these characteristics were derived the resistances $\rho$, respectively. The ratios of the resistances obtained when magnetic field was present to the resistance $\rho_\infty$ obtained when magnetic field was absent (hereinafter referred to as the resistance ratio) were plotted against the electric fields applied to the element, and the characteristics as shown in FIG. 2 were obtained. In FIG. 2, curves 2, 3, 4, 5, 6, 7 and 8 represent the characteristics, respectively, for the strengths 2, 4, 6, 8, 10, 12 and 13.5 kilogauss of the applied magnetic field.

As is shown in FIG. 2, the applied electric field has a region, below the field strength of 1 volt/cm., in which the resistance of the semiconductor element shows a decrease with respect to the electric field, and oscillation occurs in this region.

This is a phenomenon which takes place when, in the relationship between the three factors, namely, the applied magnetic field, the effective mass of the conduction electron (or positive hole) flowing through the semiconductor element, and the electron temperature of the conduction electron (or positive hole), $$\hbar\omega\left(=\frac{\hbar eH}{m^*c}\right)$$

is considerably greater than $k$T, where $\hbar$ represents the quotient of Planck's constant divided by $2\pi$; $\omega$ represents the angular frequency of the cyclotron motion of the conduction electron (or positive hole) caused by the applied magnetic field; $e$ represents the electric change of the conduction electron (or positive hole); $k$ represents Boltzmann's constant; $m^*$ represents the effective mass of electron (or positive hole); T represents the electron temperature which, in the present invention, is substantially equal to the temperature of the semiconductor element; C represents the velocity of light; and H represents the strength of the applied magnetic field. This condition is called quantum condition. In the following, although discussions will be made referring to conduction electrons in an n-type semiconductor element, similar discussions are applicable to positive holes in a p-type semiconductor element.

When this phenomenon is considered from the view point of energy level, the conduction electrons existing in the conduction band are allowed to exist only in several energy levels which are separated by $\hbar\pi$ in energy from each other, due to the quantized cyclotron motion caused by the applied magnetic field. In case this energy separation of $\hbar\pi$ is considerably greater than the mean energy $k$T of the conduction electrons, all of the conduction electrons occupy the lowest level of said several levels. (This lowest level will hereinafter be referred to as the quantum limit.) In other words, said phenomenon is one which occurs in the state of the quantum limit. This is also a phenomenon which can be seen when the impurity concentration, the strength of the magnetic field and the strength of the electric field take such values as would cause the conduction electrons to perform cyclotron motion to a sufficient degree within the semiconductor element during the period till the conduction electrons become scattered within the element by dint of the impurity and yet would not cause the conduction electrons to ionize a number of impurity atoms by impact to abruptly increase in number of conduction electrons resulting in the occurrence of negative resistance.

Figure 3:
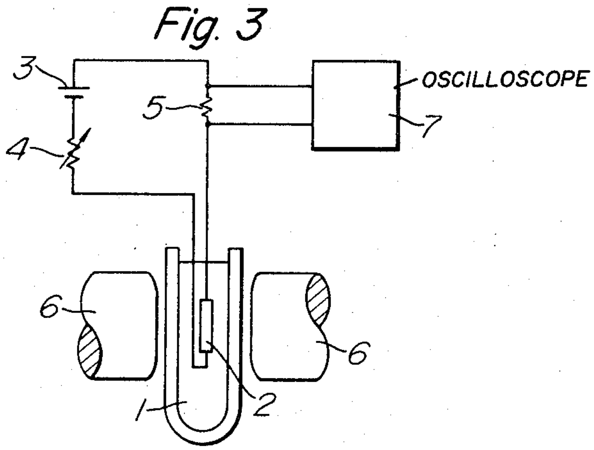
FIG. 3 is a schematic diagram of an embodiment of the invention.
Figure 4:
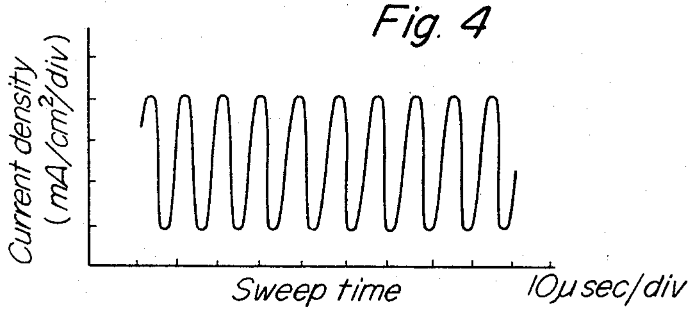
FIG. 4 is an example of the waveform of the oscillation observed.

Now, an embodiment of the present invention will be described by referreing to FIG. 3. Using a power source 3, a variable resistor 4 and an output resistor 5, arranged in series with a semiconductor element 2 consisting of an n-type InSb bulk immersed in liquid helium indicated at 1, an electric field and a current are applied to said element 2. A magnetic field is applied to said element 2 in a direction transverse to the direction of said electric field by magnetic poles 6. By arranging the element so as to have a low impurity concentration and also be setting the applied electric and magnetic fields so as to be in the decreasing resistivity ratio region as shown in FIG. 2, a current oscillation is caused to occur. This oscillation when viewed on an oscilloscope 7, shows a pattern as illustrated in FIG. 4. In case an element made of pyrographite whose effective mass of conduction electrons is one fiftieth of the of the n-type InSb, the condition of $$\hbar\omega=\frac{\hbar eH}{m^*c}\gg kT$$

is satisfied even at 100° K. By setting both the electric and magnetic fields in the same manner as that described above, it is also possible to cause the semiconductor element to produce oscillation.

The oscillation produced by these semiconductor elements is a self-oscillation and this is not the oscillation which is caused by an external circuit. The oscillation produced by these semiconductor elements can vary depending on the bias current and the applied magnetic field. Let us now assume that $\alpha$ and $\beta$ represent constants; that H represents the applied magnetic field; and that I represents the bias current density. There exists a relationship between the oscillation frequency $f$ and these factors that, approximately, $f=\alpha I(\beta-H)$. To show an example, a two-terminal semiconductor element was prepared with an n-type InSb bar of 1 mm. x 1 mm. x 5 mm. having an impurity atom concentration of about $10^{14}$ atoms/cc. While holding the element at a temperature of 4° K. or lower, the strength of the applied magnetic field was changed up to 10 kilogauss, and the strength of the bias current was changed to cover the entire range of the non-linearity region of the voltage-current characteristics. The oscillation frequency showed variation between 100 kc. and 100 mc. The amplitude of the oscillation varied depending on the magnitude of the angle of intersection between the magnetic field and the electric field applied, and the maximum amplitude was noted when the angle of intersection was shifted by an appropriate amount from right angle. The frequency also varied with the amount of the intersection angle. However, minimum change in the frequency was noted in the range of intersection angle from 30 to 150 degrees. In another experiment using a different element inserted in a resonance cavity, an oscillation with a frequency of the order of 1 gc. was noted.

As has been discussed, the present invention concerns an oscillation which takes place when the applied electric field is very weak of the order of 1 volt/cm. or less. This means that, according to the present invention, the consumption of the electric power is trifle and that the dissipation of power is very small. Hence, not only is there a merit that the element is not easily degraded, but there are advantages that the oscillation frequency can be varied easily and extensively by changing the magnitude of the applied bias current and/or magnetic field. Therefore, the present invention affords flexibility in its utilization, and provides unusual advantages as compared with the prior art. The present invention has a still further advantage that frequency conversion and frequency modulation can be effected by modulating the applied bias current and magnetic field.

What is claimed is:

1. A solid state oscillator comprising a semiconductor element provided with a pair of electrodes in ohmic contact, means for holding said semiconductor element at a low temperature, means for applying a potential across the electrodes to produce an electric field of the order of 1 volt/cm., means for applying a magnetic field to the semiconductor element in a manner such that said magnetic and electric fields are applied in a crossed relation to each other and have strengths such that said semiconductor element is operated in a non-linear decreasing resistivity ratio region of its electric field-current characteristic curve in the state of the quantum limit.

2. A solid state oscillator according to claim 1, characterized in that the oscillator further comprises means fot superposing a modulating signal on the semiconductor element.

3. A solid state oscillator according to claim 2 wherein the modulating signal is superposed on the electric field.

4. A solid state oscillator according to claim 2 wherein the modulating signal is superposed on the magnetic field.

5. A solid state oscillator according to claim 1 wherein the semiconductor element has a low impurity concentration.

6. A solid state oscillator according to claim 5 wherein the semiconductor element is taken from the group comprising InSb, PbTe and pyrographite.

7. A solid state oscillator according to claim 6, characterized in that the oscillator further comprises means for superposing a modulating signal on the semiconductor element.

References Cited

UNITED STATES PATENTS

| | | | |
|---|---|---|---|
| 2,944,167 | 7/1960 | Matare | 331—107 X |
| 3,293,567 | 12/1966 | Komatsubara et al. | 331—107 |

OTHER REFERENCES

R. D. Larrabee et al., "The Oscillistor—New Type of Semiconductor Oscillator," Journal of Applied Physics, vol. 31, September 1960, pp. 1519–1523, 331–107.

JOHN KOMINSKI, *Primary Examiner.*

ROY LAKE, *Examiner.*

S. H. GRIMM, *Assistant Examiner.*